United States Patent
Nakamura et al.

(10) Patent No.: US 6,391,123 B1
(45) Date of Patent: May 21, 2002

(54) SOLDER PASTE

(75) Inventors: Sinzo Nakamura, Mouka; Ryoichi Kurata, Tochigi; Hiroshi Takahashi, Utsunomiya, all of (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

(21) Appl. No.: 09/970,036

(22) Filed: Oct. 4, 2001

(30) Foreign Application Priority Data

Oct. 5, 2000 (JP) ........................................ 2000-306006

(51) Int. Cl.[7] ............................................... B23K 35/26

(52) U.S. Cl. .......................................................... 148/24

(58) Field of Search ........................................... 148/24

(56) References Cited

U.S. PATENT DOCUMENTS 5,759,379 A * 6/1998 Cavallotti et al. .......... 205/177

* cited by examiner

Primary Examiner—Daniel J. Jenkins
(74) Attorney, Agent, or Firm—Michael Tobias

(57) ABSTRACT

A solder paste comprises a lead-free solder alloy powder and a flux and is suitable for use in reflow soldering of electronic parts at a soldering temperature of 230° C. or below with minimized damage to the electronic parts to form soldered joints of good bond strength. The solder alloy powder is a mixture of from 10 to 30 vol % of a first powder of an Sn—Bi alloy consisting essentially of 10–45 wt % of Bi and a balance of Sn and from 70 to 90 vol % of a second powder of an Sn—Zn alloy consisting essentially of 9–15 wt % of Zn and a balance of Sn. The mixture gives an alloy having a composition upon melting which consists essentially of 7–11 wt % of Zn, 1–5 wt % of Bi, and a balance of Sn.

7 Claims, No Drawings

SOLDER PASTE

BACKGROUND OF THE INVENTION

1. Field of the Invention

This invention relates to a solder paste suitable for use in reflow soldering of electronic parts mounted on printed circuit boards. More particularly, it is concerned with a solder paste made of a lead-free solder alloy of an Sn—Zn—Bi ternary system.

2. Description of the Related Art

Electronic parts for use in electronic appliances can be mounted on printed circuit boards either by insertion mounting technology (IMT) (also called through hole mounting technology or TMT) or surface mounting technology (SMT).

Electronic parts to be mounted by IMT comprise electronic elements having elongated rod-like or pin-like leads projecting therefrom. They are normally soldered by the flow soldering technique. In a typical process of IMT, electronic parts are mounted on one surface of a printed circuit board by inserting the leads of each part into through holes formed in the board until the leads pass through the holes, and the leads are secured to lands formed on the opposite surface of the board around the through holes by flow soldering, which includes the steps of application of a flux, preheating, contact with a molten solder, and cooling.

IMT is disadvantageous in that there is a limit to the extent to which the overall size of the electronic parts, including leads, can be reduced, particularly in the case of discrete single function parts such as resistors and capacitors. Another problem of IMT particularly encountered with transistors and pin grid arrays (PGA's) having a great number of leads is that it is difficult to insert all the leads completely into the through holes of the board, and some leads may be bent by failure to be in alignment with the through holes.

In view of these problems of IMT, SMT has recently been employed widely. Electronic parts to be mounted by SMT are called surface mount devices (SMD's) and they include chip-type, discrete, single-function parts such as resistors and capacitors as well as IC packages such as quad flat packages (QFP's) and small outline packages (SOP's).

SMD's are soldered on the same surface of a printed circuit board on which they are mounted without their leads being inserted through holes. Therefore, SMD's are not suitable for soldering by flow soldering, in which the areas to be soldered must be contacted with molten solder. If SMD's are soldered by flow soldering, they may come into direct contact with the molten solder, which may result in thermal damage thereto, or the molten solder may be prevented from attaching to all the areas to be soldered due to the uneven surface of the printed circuit board.

For this reason, most SMD's are soldered by reflow soldering. In a typical process of SMT employing reflow soldering, a solder paste which is comprised of a solder alloy powder uniformly mixed with a flux is applied to the surface of a printed circuit board on which SMD's are to be mounted by printing or dispensing. Thereafter, SMD's are disposed on that surface of the printed circuit board, and the board with the SMD's disposed thereon is heated in a reflow furnace to a soldering temperature sufficient to allow the solder alloy powder to melt in order to perform soldering. The above-described problems of flow soldering when applied to soldering of SMD's can be eliminated by reflow soldering.

Reflow soldering causes the entire printed circuit board to be heated along with the electronic parts (SMD's) disposed thereon. In order to minimize adverse thermal effects of this heating on the printed circuit board and SMD's and prevent bumping (sudden splashing) of the solder paste during heating, the reflow furnace may be designed such that preheating is performed at a temperature in the range from 100 to 170° C. before main heating to the soldering temperature, thereby minimizing the duration of main heating.

The soldering temperature, which is the peak temperature for main heating, is normally from 20 to 40° C. above the liquidus temperature of the solder alloy powder used in the solder paste in order to completely melt the powder, and it varies to a certain extent depending on the size and thickness of the printed circuit board and the packing density of the electronic parts mounted thereon. The soldering temperature is recommended to be as low as possible in order to minimize adverse thermal effects particularly on the electronic parts disposed on the board. Therefore, it is preferable to use a soldering alloy powder having a low liquidus temperature in order to lower the soldering temperature.

The solder alloy powder used in a conventional solder paste is a powder of an Sn—Pb solder alloy, particularly an Sn—Pb eutectic solder alloy, in view of its low melting temperature of 183° C. and good solderability. Soldering with a conventional solder paste prepared from an Sn—Pb eutectic solder alloy powder is generally performed at a temperature of 230° C. or below after preheating to minimize the duration of main heating. Such soldering conditions are generally sufficient to avoid thermal damage to SMD's and printed circuit boards during reflow soldering.

When electronic appliances are to be discarded, they are typically disposed of in landfills, where they may be brought into contact with rain, which has recently become acidic. Such acid rain causes the Sn—Pb alloy solders used in discarded electronic appliances present in landfills to dissolve and contaminate groundwater. If groundwater contaminated with lead is ingested by a person for many years, the accumulation of lead in the person's body may result in lead poisoning. For this reason, it has recently been recommended to use a lead-free solder alloy in the electronics industry. This recommendation also applies for a solder paste for use in reflow soldering.

Typical lead-free solder alloys are Sn-based alloys comprising a major proportion of Sn and a small amount of at least one additional element such as Ag, Cu, Bi, Sb, and Zn.

Sn—Ag alloys have a eutectic composition of Sn-3.5 Ag with a melting temperature of about 220° C. Even if this composition, which has the lowest melting temperature among Sn—Ag alloys, is used as a solder alloy, the soldering temperature will be as high as 250° C. or above, which may cause thermal damage to electronic parts during reflow soldering. Addition of a small amount of Bi and/or In to an Sn—Ag alloys can decrease the solidus temperature of the alloy, but its liquidus temperature is not decreased significantly, so the soldering temperature still remains high. Sn—Ag alloys have another problem of poor surface gloss of soldered joints formed therefrom, leading to a decrease in attractiveness of the soldered products.

Sn—Cu alloys have a melting temperature of 227° C. for a eutectic composition of Sn-0.7 Cu, which makes the soldering temperature too high to avoid thermal damage to electronic parts during reflow soldering. These alloys have another problem of poor solderability. The addition of Bi and/or In is not effective to significantly decrease the liquidus temperature of these alloys, as is the case with Sn—Ag alloys.

Sn—Bi alloys have a very low melting temperature of 139° C. for a eutectic composition of Sn-57 Bi. Therefore, they make it possible to perform reflow soldering even at a lower temperature than the conventional Sn—Pb eutectic solder alloy with no concern about thermal damage to electronic parts. However, such alloys are very brittle due to the presence of a large proportion of Bi, and the resulting soldered joints are readily detached when subjected to even a mild mechanical impact.

Sn—Zn alloys have a eutectic composition of Sn-9 Zn with a melting temperature of 199° C., which is low enough to make it possible to perform reflow soldering at a soldering temperature of 230° C. or below to minimize thermal damage. The alloying element Zn or zinc is harmless to human bodies, and it is an abundant and inexpensive element. Therefore, Sn—Zn lead-free solder alloys are advantageous from the viewpoints of safety and economy.

Although reflow soldering with a solder paste prepared from a powder of an Sn—Zn solder alloy, particularly Sn-9 Zn alloy, can be performed at a temperature 230° C. or below, it takes a considerable length of time for main heating to completely melt the solder alloy powder present in various locations on the surface of a printed circuit board due to a local temperature difference in the course of heating caused by variations in thickness and packaging density. In other words, an extended time for main heating is necessary to melt the solder alloy powder completely in all the applied spots on the board. As a result, even when the soldering temperature is as low as 230° C. or slightly below, the extended duration of main heating in a reflow furnace may cause thermal damage to electronic parts.

Another problem of an Sn—Zn solder alloy is that it has poor solderability and tends to form soldered joints having numerous voids and traces of dewetting. Voids are vacancies like air bubbles formed inside soldered joints, particularly at the interface between soldered joints and their parent material, i.e., a printed circuit board. A soldered joint leaving numerous voids therein has a reduced bonding area to the parent material and hence a reduced bond strength, and it tends to be readily detached when a weak force is applied to the electronic part secured by the soldered joint.

Dewetting is a phenomenon in which molten solder which has initially wetted the surface of a parent material and spread thereon is partially or totally repelled by the parent material and constricted into a narrow area. The dewetting phenomenon also leads to a reduction in bonding area between the soldered joint and the parent material and weakens the bond strength of the resulting soldered joint.

SUMMARY OF THE INVENTION

Thus, there is a need to provide a solder paste prepared from a lead-free, low-melting, solder alloy powder which can be used in reflow soldering at a soldering temperature of 230° C. or below without extending the time for main heating and which can form soldered joints having good bond strength without forming numerous voids and causing dewetting during reflow soldering.

According to the present invention, the above-described need can be fulfilled by a solder paste prepared from a mixture of a major proportion of an Sn—Zn alloy powder and a minor proportion of a non-eutectic Sn—Bi alloy powder.

Thus, the present invention provides a solder paste comprising a solder alloy powder and a flux, wherein the solder alloy powder is a mixture of from 10 to 30 vol % of a first powder of an Sn—Bi alloy consisting essentially of 10–45 wt % of Bi and a balance of Sn and from 70 to 90 vol % of a second powder of an Sn—Zn alloy consisting essentially of 9–15 wt % of Zn and a balance of Sn, the mixture having a composition which consists essentially of 7–11 wt % of Zn, 1–5 wt % of Bi, and a balance of Sn.

Other features and advantages of the present invention will be apparent by reading the following description.

DESCRIPTION OF PREFERRED EMBODIMENTS

When two solder alloys in powder form having the same liquidus temperature are simultaneously heated to the same temperature to melt, a solder alloy having a lower solidus temperature melts completely in a shorter period since it begins to melt earlier at the lower solidus temperature than the other solder alloy having a higher solidus temperature.

It has been found that addition of a certain third element to an Sn-9 Zn eutectic alloy to lower the solidus temperature is effective for reducing the time for main heating required to completely melt a solder alloy powder during reflow soldering. Candidates for such a third metal include In and Bi, which are known to have an effect of lowering the melting temperature of an alloy to which they are added.

Among these, In (indium) is expensive, and the addition of In increases the reactivity of the resulting alloy. As a result, a solder paste formed from an In-containing solder alloy powder and a flux tends to have a viscosity which is rapidly increased in a is short period due to a reaction of the solder alloy powder with the flux. The solder paste having an increased viscosity is no longer suitable for use in application by screen printing with a mask or through needle-like fine orifices of a dispenser.

Bi (bismuth) is less expensive than In, and it is also less reactive with a flux. The addition of a small proportion of Bi to an Sn—Zn alloy having an approximately eutectic composition can lower the solidus temperature of the alloy without causing a rapid increase in the viscosity of a solder paste.

For this reason, according to the present invention, Bi is added to the Sn—Zn alloy to lower the solidus temperature of the alloy, thereby reducing the time for main heating required to completely melt a powder of the alloy during reflow soldering. Bi is present in the resulting Sn—Zn—Bi alloy in a proportion of from 1% to 5% by weight. Addition of less than 1% by weight of Bi is not effective for lowering the solidus temperature of an Sn—Zn alloy. If added in a proportion of more than 5%, Bi makes the alloy brittle and causes the formation of soldered joints which have a decreased mechanical strength and may readily be detached upon application of a mechanical impact or vibration thereto.

In order to keep the soldering temperature below 230° C. which is required to avoid thermal damage to electronic parts during reflow soldering, the solder alloy used in the present invention should have a liquidus temperature of at most 205° C., which is only slightly higher than that of the Sn-9 Zn eutectic alloy (199° C.). For this purpose, the proportion of Zn present in the alloy is limited to a range of from 7% to 11% by weight.

Thus, a lead-free solder alloy having a composition consisting essentially of 7–11 wt % of Zn, 1–5 wt % of Bi, and a balance of Sn has an increased difference between its solidus and liquidus temperatures. For example, an Sn-8 Zn-3 Bi alloy has a solidus temperature of 190° C. and a liquidus temperature of 196° C., and the difference between the solidus and liquidus temperatures is 6° C. When a solder paste prepared from a powder of this solder alloy is applied to a printed circuit board and heated in a reflow furnace, partial melting of the solder alloy powder begins as soon as the surface temperature of the printed circuit board reaches 190° C. (liquidus temperature) particularly in those areas of the board a having a lower heat capacity. As the surface temperature exceeds 196° C., melting of the entire solder alloy powder begins, and when it reaches the soldering temperature, e.g., 230° C., complete melting of the solder alloy powder has occurred already or occurs shortly.

The above-described Sn—Zn—Bi ternary solder alloy has the advantage of being capable of melting completely when heated for a short period at a temperature of 230° C. or below to avoid thermal damage to electronic parts during reflow soldering. However, it still has the problems of forming soldered joints having numerous voids and many dewetting spots in reflow soldering.

The present inventors found that these problems of the Sn—Zn—Bi alloy can be eliminated by using a mixture of two solder alloy powders having different solidus temperatures from each other. Specifically, the solder alloy powder used in a solder paste according to the present invention is a mixture of a first Sn—Bi alloy powder and a second Sn—Zn alloy powder. The two alloy powders are mixed in a proportion that gives an alloy upon melting which consists essentially of 7–11 wt % of Zn, 1–5 wt % of Bi, and a balance of Sn.

The present inventors found that the formation of voids and dewetting encountered in reflow soldering occur by the following mechanism. When a solder paste consisting of a powder of an Sn-8 Zn-3 Bi solder alloy, for example, and a flux is heated for reflow soldering, the flux, which is an organic composition having a softening temperature much lower than the solidus temperature of the solder alloy, liquefies first at the preheating stage in a temperature range of from 100 to 170° C. The liquefied flux is initially retained in the interstices between particles of the solder alloy powder, but as the temperature increases, it vaporizes to form gas. As soon as the temperature of the solder alloy powder exceeds 190° C., which is the solidus temperature of the solder alloy, it begins to melt all at once while entrapping therein some of the gas formed from the flux, resulting in the formation of voids. Dewetting is caused by the fact that the Sn-8 Zn-3 Bi solder alloy itself does not have good wetting properties sufficient to maintain the molten solder alloy in a well spread condition and the molten solder alloy is repelled by the parent material (printed circuit board) to cause dewetting.

According to the present invention, a mixture of two solder alloy powders is used in which a first powder is of an Sn-Bi solder alloy having good wetting properties and a lower, solidus temperature and a second powder is of an Sn—Zn solder alloy having relatively poor wetting properties and a higher solidus temperature.

The first powder of an Sn—Bi solder alloy is not of a eutectic composition of Sn-57 Bi, but the Sn—Bi alloy has a composition consisting essentially of 10–45 wt % of Bi and a balance of Sn. The composition of this alloy is selected so that the difference between the solidus and liquidus temperatures of the alloy is at least 25° C. and preferably at least 30° C. The Sn—Bi alloy for the first powder has a solidus temperature of 139° C. and a liquidus temperature of 169° C. or above.

The Sn—Zn solder alloy for the second powder has a composition consisting essentially of 9–15 wt % of Zn and a balance of Sn. The composition makes it possible to perform reflow soldering by main heating at a temperature of 230° C. or below. The Sn—Zn alloy has a solidus temperature of 199° C., which is 60° C. higher than that of the Sn—Bi alloy for the first powder (139° C.).

In the course of heating a solder flux according to the present invention to a soldering temperature, the first powder of an Sn—Bi alloy having a lower solidus temperature begins to melt at a temperature of 139° C. (solidus temperature of the alloy) in a preheating stage, and melting of the first powder continues at least until the powder is heated to the liquidus temperature thereof (169° C. or higher). Thus, the first powder takes an extended time to; completely melt due to a big difference between the solidus and liquidus temperatures of the alloy, and the powder is kept in a highly viscous, partially molten state for an extended time, during which time the liquefied flux, which is much less viscous than the partially molten solder alloy, can be separated and expelled from the solder alloy and released by vaporization. Therefore, it is much less likely that the liquefied flux will be entrapped within the molten solder to form voids.

The second Sn—Zn alloy powder begins to melt after the first Sn—Bi alloy powder has melted completely or almost completely since its solidus temperature is much higher than that of the first alloy powder and even higher than the liquidus temperature thereof. Thus, before melting of the second powder, the surface to be soldered is covered by the molten alloy from the first powder which has good wetting properties, so the second solder alloy can spread sufficiently upon melting despite its relatively poor wetting properties, thereby minimizing dewetting.

The first and second solder alloy powders are mixed in such a proportion that the resulting mixture contains from 10% to 30% of the first solder alloy powder and from 70% to 90% of the second solder alloy powder by volume. The proportion of at least 10% by volume of the first alloy powder is sufficient to fill the interstices formed between particles of the second alloy powder with molten first alloy after the first alloy melts earlier so that any flux remaining in the interstices can be expelled by the molten first alloy to avoid the formation of voids. The presence of more than 30% by volume of the first alloy powder in the mixture may cause slumping (over-spreading of the solder paste) or formation of fine solder balls during reflow soldering.

The proportions of the first and second solder alloy powders in the mixture are also selected so as to give an Sn—Zn—Bi alloy upon melting which has a composition consisting essentially of 7–11 wt % of An, 1–5 wt % of Bi, and a balance of Sn, for the reason mentioned previously. Thus, although the Sn—Bi alloy of the first powder is rather brittle, the mixture of the first and second powders can form soldered joints having good bond strength.

In a preferred embodiment,
- the Sn—Bi solder alloy for the first powder has a composition consisting essentially of 10–35 wt % and more preferably 12–30 wt % of Bi and a balance of Sn, and/or
- the Sn—Zn solder alloy for the second powder has a composition consisting essentially of 9–13 wt % and more preferably greater than 9 wt % and not greater than 11 wt % of Zn and a balance of Sn, and/or
- the first powder is present in the powder mixture in a proportion of from about 12% to about 25% by volume and the remainder is constituted by the second powder, and/or
- the mixture of the first and second powders has a composition consisting essentially of 7–10 wt % of Zn, 2–4 wt % of Bi, and a balance of Sn. The Zn content of the mixture is more preferably at least 7 wt % and lower than 9 wt %.

The solder alloy powders may be produced in a conventional manner, e.g., by gas atomization or centrifugal atomization. The particle size of the solder alloy powders is typically in the range of from 200 to 400 mesh, but finer powders may be used. All the solder powders need not have the same particle size. One or both of the first and second powders in the solder alloy powder mixture may be comprised of two or more different alloys which have compositions falling within the prescribed ranges.

The flux used in the solder paste according to the present invention may be any flux suitable for use in soldering of electronic parts and in preparing a solder paste. The flux is preferably a rosin flux, which is a non-water soluble, rosin-based flux. The rosin in the flux may be either a natural rosin or a modified rosin including a polymerized rosin. The flux usually further contains an activator and a solvent and may have a pasty consistency. The flux is usually present in a solder paste in a proportion of 5–20 wt %.

The solder paste according to the present invention may be used for reflow soldering in a conventional manner in a reflow furnace. The heating may be performed in two stages while the temperature is kept for a while at a constant preheating temperature in the range of about 100 to 170° C. before heating to the temperature for main heating, which is preferably 230° C. or below, or the temperature may be elevated gradually to the temperature for main heating through the preheating temperature range. Since the first solder alloy powder begins to melt in the preheating temperature range, the duration of main heating can be reduced to melt the entire solder powders completely and form soldered joints.

The following examples are presented to further illustrate the present invention. These examples are to be considered in all respects as illustrative and not restrictive. In the examples, the figures preceding the element Zn or Bi indicates its proportion in weight percent.

EXAMPLES

Example 1

A solder paste was prepared by uniformly mixing 900 grams of a solder alloy powder and 100 grams of a pasty rosin flux. The solder alloy powder was a mixture of the following two alloy powders:

20 vol % of a first powder of an Sn-15 Bi alloy, and
80 vol % of a second powder of an Sn-10 Zn alloy.

The solder alloy powder mixture gives an Sn-8 Zn-3 Bi alloy upon melting.

Example 2

A solder paste was prepared by uniformly mixing 900 grams of a solder alloy powder and 100 grams of the same rosin flux as was used in Example 1. The solder alloy powder was a mixture of the following two solder alloy powders:

15 vol % of a first powder of an Sn-20 Bi alloy, and
85 vol % of a second powder of an Sn-10 Zn alloy.

The solder alloy powder mixture gives an Sn-8 Zn-3 Bi alloy upon melting.

Comparative Example 1

A solder paste was prepared by uniformly mixing 900 grams of a powder of an Sn-8 Zn-3 Bi alloy and 100 grams of the same rosin flux as was used in Example 1.

Comparative Example 2

A solder paste was prepared by uniformly mixing 900 grams of a solder alloy powder and 100 grams of the same rosin flux as was used in Example 1. The solder alloy power was a mixture of the following two solder alloy powders.

30 wt % of a first powder of an Sn-57 Bi alloy, and
70 wt % of a second powder of an Sn-9 Zn alloy.

Thus, both the alloys used had eutectic compositions. The solder alloy powder mixture gives an Sn-6.2 Zn-17.1 Bi alloy upon melting.

Using each of the solder pastes prepared in the above Examples and Comparative Examples which were applied to a printed circuit board by screen printing, SMD's disposed on the printed circuit board were soldered by reflow soldering with such a heating profile in a reflow furnace that the duration in the temperature range from 150 to 170° C. in a preheating stage was about 30 seconds and the duration at the peak temperature of 230° C. in a main heating stage was from 20 to 60 seconds.

The solder pastes of Examples 1 and 2 could form soldered joints with little voids and dewetting spots, and they uniformly deposited on the areas to which they had been applied by screen printing.

In contrast, numerous voids and dewetting spots were found in the soldered joints formed with the solder paste of Comparative Example 1. The soldered joints formed with the solder paste of Comparative Example 2 showed a decreased number of dewetting spots but still included numerous voids.

Thus, a solder paste according to the present invention can be used to perform reflow soldering of electronic parts by exposure to the main heating temperature of 230° C. or below for a short period in a reflow furnace to completely melt the solder alloys present therein, thereby minimizing thermal damage to the electronic parts and occurrence of bonding failures. In addition, the resulting soldered joints formed from the solder paste are reliable, since the formation of voids and dewetting spots which weaken the bond strength of the soldered joints is prevented. As a whole, the performance of the solder paste is superior to that of any conventional solder paste prepared from a lead-free solder alloy powder.

It will be appreciated by those skilled in the art that numerous variations and modifications may be made to the specific embodiments of the present invention described above without departing from the spirit or scope of the invention as broadly described.

What is claimed is:

1. A solder paste comprising a solder alloy powder and a flux, wherein the older alloy powder is a mixture of from 10 to 30 vol % of a first powder of an Sn—Bi alloy consisting essentially of 10–45 wt % of Bi and a balance of Sn and from 70 to 90 vol % of a second powder of an Sn—Zn alloy consisting essentially of 9–15 wt % of Zn and a balance of Sn, the mixture having a composition which consists essentially of 7–11 wt % of Zn, 1–5 wt % of Bi, and a balance of Sn.

2. A solder paste according to claim 1 wherein the Sn—Bi solder alloy for the first powder has a composition consisting essentially of 10–35 wt % of Bi and a balance of Sn.

3. A solder paste according to claim 1 wherein the Sn—Zn solder alloy for the second powder has a composition consisting essentially of 9–13 wt % of Zn and a balance of Sn.

4. A solder paste according to claim 1 wherein the first powder is present in the powder mixture in a proportion of from about 12% to about 25% by volume and the remainder is constituted by the second powder.

5. A solder paste according to claim 1 wherein the mixture of the first and second powders has a composition consisting essentially of 7–10 wt % of Zn, 2–4 wt % of Bi, and a balance of Sn.

6. A solder paste according to claim 1 wherein the flux is a rosin flux.

7. A solder paste according to claim 1 wherein the flux is present in the solder paste in a proportion of 5%–20% by weight.

* * * * *